(12) United States Patent
Garcia Granda et al.

(10) Patent No.: US 10,394,132 B2
(45) Date of Patent: Aug. 27, 2019

(54) METROLOGY ROBUSTNESS BASED ON THROUGH-WAVELENGTH SIMILARITY

(71) Applicant: ASML NETHERLANDS B.V., Veldhoven (NL)

(72) Inventors: Miguel Garcia Granda, Veldhoven (NL); Christian Marinus Leewis, Eindhoven (NL); Frank Staals, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/096,360

(22) PCT Filed: Apr. 24, 2017

(86) PCT No.: PCT/EP2017/059642
§ 371 (c)(1),
(2) Date: Oct. 25, 2018

(87) PCT Pub. No.: WO2017/198422
PCT Pub. Date: Nov. 23, 2017

(65) Prior Publication Data
US 2019/0129319 A1  May 2, 2019

(30) Foreign Application Priority Data
May 17, 2016 (EP) .................... 16169982

(51) Int. Cl.
*G03B 27/52* (2006.01)
*G03F 7/20* (2006.01)
*G03F 9/00* (2006.01)

(52) U.S. Cl.
CPC .......... *G03F 7/705* (2013.01); *G03F 7/70525* (2013.01); *G03F 7/70533* (2013.01);
(Continued)

(58) Field of Classification Search
CPC ............ G01N 21/9501; G01N 21/956; G01N 21/95607; G01N 21/47; G01N 21/4788;
(Continued)

(56) References Cited

U.S. PATENT DOCUMENTS 4,906,852 A * 3/1990 Nakata .................. G03F 9/7076
250/548
5,969,441 A 10/1999 Loopstra et al.
(Continued)

FOREIGN PATENT DOCUMENTS

| WO | 2009078708 | 6/2009 |
|----|------------|--------|
| WO | 2009106279 | 9/2009 |
| WO | 2010059954 | 5/2010 |

OTHER PUBLICATIONS

Internationanl Search Report and Written Opinion issued in corresponding PCT Patent Application No. PCT/EP2017/059642, dated Jul. 20, 2017.
(Continued)

*Primary Examiner* — Christina A Riddle
(74) *Attorney, Agent, or Firm* — Pillsbury Winthrop Shaw Pittman LLP

(57) ABSTRACT

A method including obtaining a measurement result from a target on a substrate, by using a substrate measurement recipe; determining, by a hardware computer system, a parameter from the measurement result, wherein the parameter characterizes dependence of the measurement result on an optical path length of the target for incident radiation used in the substrate measurement recipe and the determining the parameter includes determining dependence of the measurement result on a relative change of wavelength of the incident radiation; and if the parameter is not within a specified range, adjusting the substrate measurement recipe.

20 Claims, 17 Drawing Sheets

(52) U.S. Cl.
CPC ...... *G03F 7/70625* (2013.01); *G03F 7/70633* (2013.01); *G03F 7/70641* (2013.01); *G03F 9/7019* (2013.01); *G03F 9/7026* (2013.01); *G03F 9/7092* (2013.01)

(58) Field of Classification Search
CPC .... G01N 21/21; G01N 21/211; G01N 21/213; G01B 11/02; G01B 11/06; G01B 11/0625–11/065; G03F 9/7026; G03F 9/7003; G03F 9/7007; G03F 9/7019; G03F 9/7023; G03F 9/7065; G03F 9/7069; G03F 9/7088; G03F 9/7092; G03F 7/70483; G03F 7/70491; G03F 7/705; G03F 7/70508–7/70533; G03F 7/70608; G03F 7/70616; G03F 7/70625–7/70641; G03F 7/70666–7/70683; G03F 7/7085; G03F 7/70566; G03F 7/70575
USPC ..... 355/52–55, 67–71, 77; 356/237.5, 237.2, 356/60, 609, 625, 630, 634–636, 448, 356/399–401; 438/16; 700/121, 700/108–110, 28–34; 702/150, 155, 158, 702/166, 170, 172, 57, 66, 70, 71, 81–82, 702/84, 94, 95, 97; 703/2
See application file for complete search history.

(56) References Cited

U.S. PATENT DOCUMENTS

| | | | |
|---|---|---|---|
| 6,961,116 | B2 | 11/2005 | Den Boef et al. |
| 7,587,704 | B2 | 9/2009 | Ye et al. |
| 2002/0173084 | A1* | 11/2002 | Ohkawa ............ G01B 11/0625 438/149 |
| 2009/0157360 | A1 | 6/2009 | Ye et al. |
| 2010/0315614 | A1 | 12/2010 | Hansen |
| 2011/0027704 | A1 | 2/2011 | Cramer et al. |
| 2011/0043791 | A1 | 2/2011 | Smilde et al. |
| 2012/0013881 | A1 | 1/2012 | Den Boef et al. |
| 2012/0242970 | A1 | 9/2012 | Smilde et al. |
| 2013/0215404 | A1 | 8/2013 | Den Boef |
| 2015/0346605 | A1* | 12/2015 | Den Boef ............... G03F 7/705 438/401 |
| 2016/0349038 | A1* | 12/2016 | Ohtsuka ............. G01B 11/0625 |
| 2016/0370717 | A1* | 12/2016 | Den Boef ........... G03F 7/70633 |

OTHER PUBLICATIONS

Paserba. Kris R: "Correlating overlay metrology precision to interlayer dielectric film properties", Proc. of SPIE, vol. 6922, Mar. 24, 2008.

\* cited by examiner

METROLOGY ROBUSTNESS BASED ON THROUGH-WAVELENGTH SIMILARITY

CROSS-REFERENCE TO RELATED APPLICATIONS

This application is the U.S. national phase entry of PCT patent application no. PCT/EP2017/059642, which was filed on Apr. 24, 2017, which claims the benefit of priority of European patent application no. 16169982.2, which was filed on May 17, 2016, and which is incorporated herein in its entirety by reference.

TECHNICAL FIELD

The description herein relates to lithographic apparatuses and processes, and more particularly to a tool and a method to inspect or measure substrates produced by the lithographic apparatuses and processes.

BACKGROUND

Manufacturing devices, such as semiconductor devices, typically involves processing a substrate (e.g., a semiconductor wafer) using a number of patterning processes and patterning apparatuses to form various features and multiple layers of the devices. Such layers and features are typically patterned using, e.g., deposition, lithography, etch, chemical-mechanical polishing, and ion implantation. Multiple devices may be patterned on a plurality of dies on a substrate and then separated into individual devices. A patterning process may involve a patterning step using a patterning apparatus, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes may be involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

A lithography apparatus can be used, for example, in a patterning process for the manufacture of integrated circuits (ICs) or other devices. In such a case, a patterning device (e.g., a mask) may contain or provide a circuit pattern corresponding to an individual layer of the device ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithography apparatus, one target portion at a time. In one type of lithography apparatus, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithography apparatus will have a reduction ratio M (e.g., 4), the speed F at which the substrate is moved will be a factor 1/M times that at which the projection beam scans the patterning device.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

SUMMARY

Disclosed herein is a method comprising: obtaining a measurement result from a measurement target on a substrate, by using a substrate measurement recipe; determining, by a hardware computer system, a parameter from the measurement result, wherein the parameter characterizes dependence of the measurement result on an optical path length of the target for incident radiation used in accordance with the substrate measurement recipe and the determining the parameter comprises determining dependence of the measurement result on a relative change of wavelength of the incident radiation; and if the parameter is not within a specified range, adjusting the substrate measurement recipe.

According to an embodiment, the measurement result comprises an overlay error, alignment, focus, or critical dimension.

According to an embodiment, the measurement result comprises a normalized intensity asymmetry of two diffraction orders from the target.

According to an embodiment, the parameter is a derivative of the measurement result with respect to a relative change of the optical path length.

According to an embodiment, determining the parameter comprises obtaining measurement results using at least two different wavelengths.

According to an embodiment, the parameter is a difference between two sets of measurement results obtained using two substrate measurement recipes with different wavelengths of the incident radiation.

According to an embodiment, adjusting the substrate measurement recipe comprises adjusting a parameter of a measurement target structure associated with the substrate measurement recipe.

According to an embodiment, the parameter of the target comprises a shape or orientation of at least part of the measurement target structure.

According to an embodiment, adjusting the substrate measurement recipe comprises adjusting a parameter of a measurement using the substrate measurement recipe.

According to an embodiment, the parameter of the measurement comprises polarization or wavelength of the incident measurement radiation.

According to an embodiment, the substrate measurement recipe uses a single incident beam.

According to an embodiment, a measurement target structure measured using the substrate measurement recipe has processed induced target asymmetry.

According to an embodiment, the method further comprises inspecting another substrate using the substrate measurement recipe.

Disclosed herein is a method comprising: obtaining a measurement result from a target on a substrate, by using each of a plurality of substrate measurement recipes; determining, by a hardware computer system, a parameter from each of the measurement results, wherein the parameter characterizes dependence of the measurement result on an optical path length of the target for incident radiation used in accordance with the substrate measurement recipe to obtain the measurement result; and selecting at least one substrate measurement recipe from the plurality based on the parameters.

According to an embodiment, determining the parameter comprises determining dependence of the measurement result on a relative change of wavelength of the incident radiation.

According to an embodiment, the measurement result comprises an overlay error, focus, alignment, or critical dimension.

According to an embodiment, the measurement result comprises a normalized intensity asymmetry of two diffraction orders from the target.

According to an embodiment, the parameter is a derivative of the measurement result with respect to a relative change of the optical path length.

According to an embodiment, determining the parameter comprises obtaining measurement results using at least two different wavelengths.

According to an embodiment, the parameter is a difference between two sets of measurement results obtained using two substrate measurement recipes with different wavelengths of the incident radiation.

According to an embodiment, at least one of the plurality of substrate measurement recipes uses a single incident beam.

According to an embodiment, a target measured using at least one of the plurality of substrate measurement recipes has processed induced target asymmetry.

According to an embodiment, the method further comprises inspecting another substrate using the selected substrate measurement recipe.

Disclosed herein is a computer program product comprising a non-transitory computer readable medium having instructions recorded thereon, the instructions when executed by a computer implementing any of the above methods.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

The terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a patterning process parameter, e.g., a lithographic projection apparatus parameter, such that device fabrication results and/or processes (e.g., of lithography) have one or more desirable characteristics, such as higher accuracy of projection of a design layout on a substrate, larger process window, etc.

Figure 1:
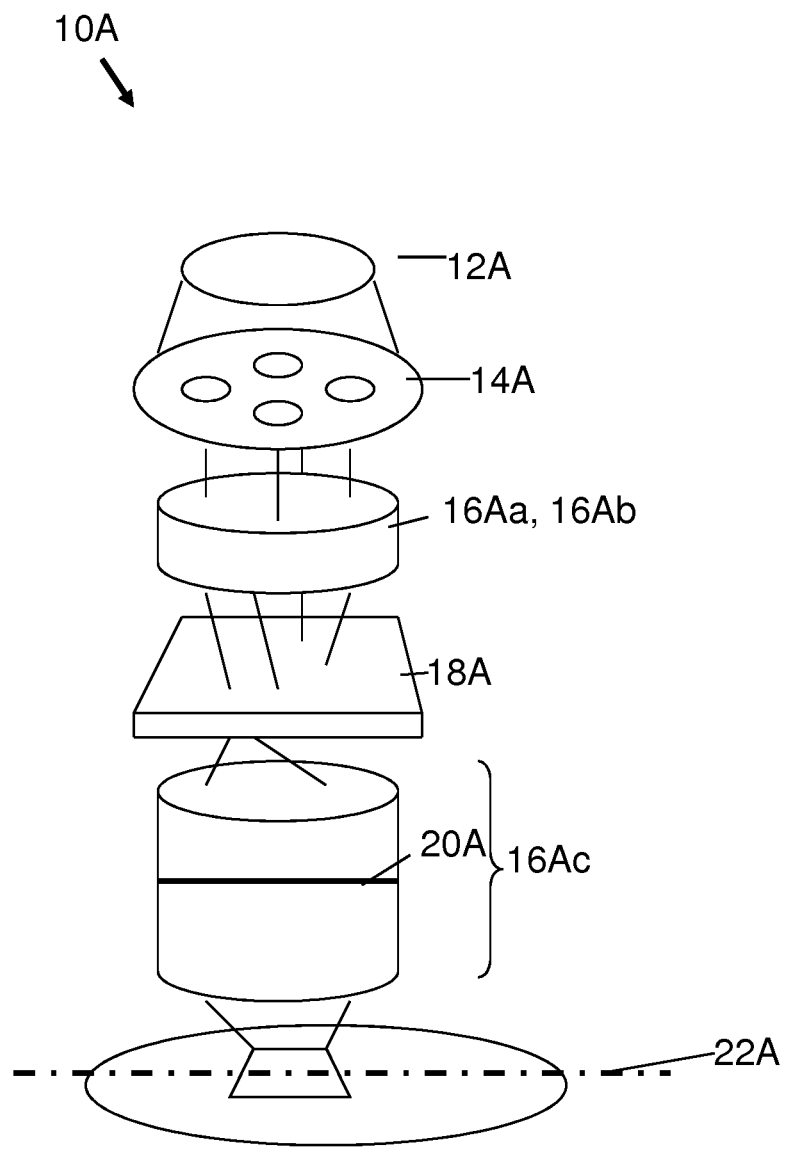
FIG. 1 is a highly schematic block diagram of various subsystems of a lithography system.

As a brief introduction, FIG. 1 illustrates an exemplary lithographic apparatus 10A. Major components include illumination optics which define the partial coherence (denoted as sigma) and which may include optics 14A, 16Aa and 16Ab that shape radiation from a radiation source 12A, which may be a deep-ultraviolet excimer laser source or other type of source including an extreme ultra violet (EUV) source (as discussed herein, the lithographic apparatus itself need not have the radiation source); and optics 16Ac that project an image of a patterning device pattern of a patterning device 18A onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

In a lithographic apparatus, a source provides illumination (i.e. radiation); projection optics direct and shapes the illumination via a patterning device and onto a substrate. The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer.

To simulate lithography in a lithography apparatus, a source model can represent optical characteristics (including radiation intensity distribution and/or phase distribution) of the source. A projection optics model can represent optical characteristics (including changes to the radiation intensity distribution and/or the phase distribution caused by the projection optics) of the projection optics. The projection optics model may include aberration caused by various factors, for example, heating of the components of the projection optics, stress caused by mechanical connections of the components of the projection optics. The source model and the projection optics model can be combined into a transmission cross coefficient (TCC) model. A design layout model can represents optical characteristics (including changes to the radiation intensity distribution and/or the phase distribution caused by a given design layout) of a design layout, which is the representation of an arrangement of features of a patterning device. An aerial image can be simulated from the source model, the projection optics model and the design layout model. A resist image can be simulated from the aerial image using a resist model. Simulation of lithography can, for example, predict contours and CDs in the resist image. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

More specifically, it is noted that the source mode can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model can represent the optical characteristics of the of the projection optics that include aberration, distortion, refractive indexes, physical sizes, physical dimensions, absorption, etc. The design layout model can also represent physical properties of a physical patterning device, as described, for example, in U.S. Pat. No. 7,587,704, which is incorporated by reference in its entirety.

The resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithography apparatus (e.g., properties of the source, the patterning device and the projection optics) dictate the aerial image. Since the patterning device used in the lithography apparatus can be changed, it is desirable to separate the optical properties of the patterning device from the optical properties of the rest of the lithography apparatus including at least the source and the projection optics.

Figure 2A:
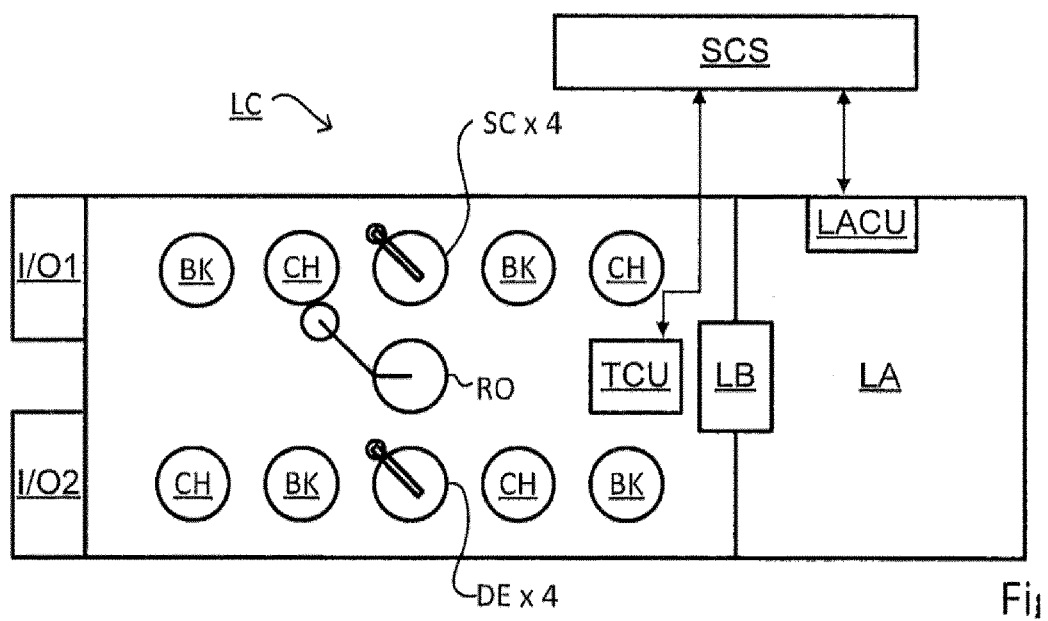
FIG. 2A schematically depicts an embodiment of a lithographic cell or cluster.

As shown in FIG. 2A, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency. The lithographic cell LC may further comprises one or more etchers to etch the substrate and one or more measuring devices configured to measure a parameter of the substrate. The measuring device may comprise an optical measurement device configured to measure a physical parameter of the substrate, such as a scatterometer, a scanning electron microscope, etc.

In a device manufacturing process (e.g., lithography process), a substrate may be subjected to various types of measurement during or after the process. The measurement may determine whether a particular substrate is defective, may establish adjustments to the process and/or one or more apparatuses used in the process (e.g., aligning two layers on the substrate or aligning the patterning device to the substrate), may measure the performance of the process and/or one or more apparatuses, or may be for other purposes. Examples of substrate measurement include optical imaging (e.g., optical microscope), non-imaging optical measurement (e.g., measurement based on diffraction such as ASML YieldStar, ASML SMASH GridAlign), mechanical measurement (e.g., profiling using a stylus, atomic force microscopy (AFM)), or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment mark, detects intensities in a pupil plane where Fourier transforms of the images are caused to interfere, and extracts positional information from the phase difference between diffraction orders of the two images which manifests as intensity variations in the interfered orders.

The measurement by a measurement apparatus may be performed in accordance with a substrate measurement recipe. The term "substrate measurement recipe" may include one or more parameters of the measurement itself, one or more parameters of a pattern measured, or both. For example, if the measurement used in a substrate measurement recipe is non-imaging diffraction-based optical measurement, the parameter of the measurement may include the wavelength of the incident radiation, the polarization of the incident radiation, the incident angle of the radiation relative to the substrate, and/or the relative orientation relative to a pattern on the substrate, of the radiation diffracted. The parameter of the measurement may include a parameter of the metrology apparatus used in the measurement. The pattern measured may be a pattern whose diffraction is measured (also known as "targets" or "target structures"). The pattern measured may be a pattern specially designed for measurement purposes. Multiple copies of a target may be placed on many places on a substrate. A parameter of the pattern measured may include the shape, orientation and/or size of at least part of the pattern. A substrate measurement recipe may be used to align a layer of a pattern being imaged against an existing pattern on a substrate. A substrate measurement recipe may be used to align the patterning device to the substrate, by measuring the relative position of the substrate.

A substrate measurement recipe may be expressed in a mathematical form: $(r_1, r_2, r_3, \ldots r_n; t_1, t_2, t_3, \ldots t_n)$, where $r_i$ are parameters of the measurement and $t_j$ are parameters of one or more patterns measured. The measurement recipe need not have parameters of one or more patterns measured or need not have parameters of the measurement.

Figure 3:
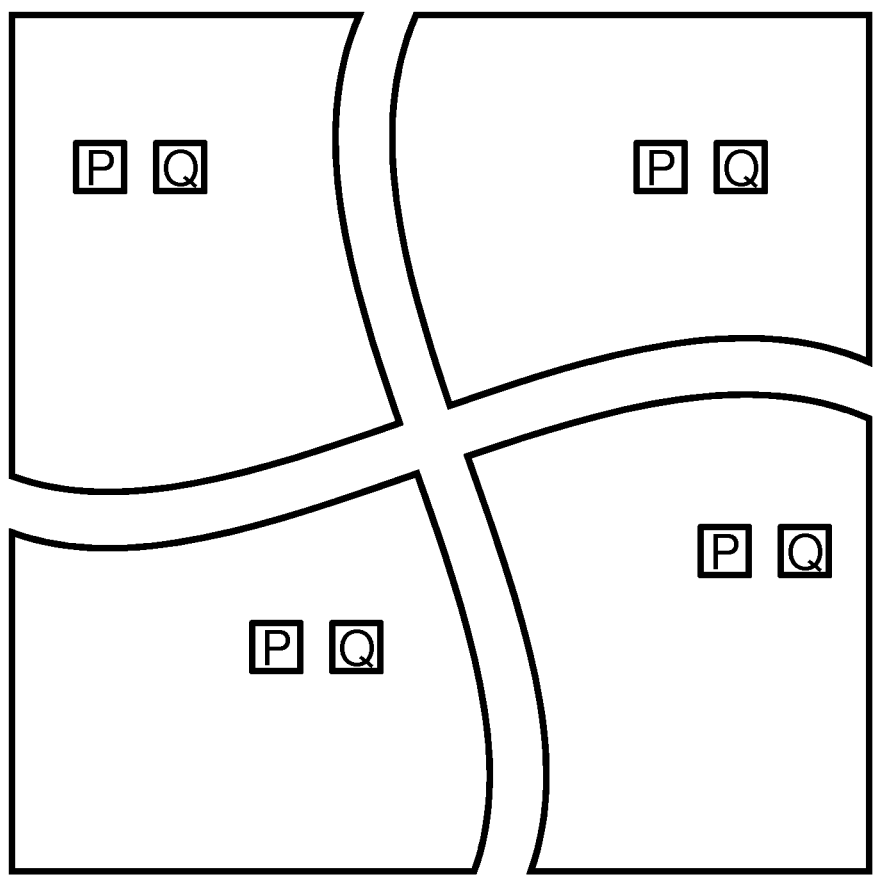
FIG. 3 schematically shows a substrate with two distinct targets P and Q, where copies of each are placed in four different areas of the substrate.

FIG. 3 schematically shows a substrate with two distinct targets P and Q, where copies of each are placed in four different areas of the substrate. The targets may include gratings, e.g., of mutually perpendicular directions. The target may include locations on a pattern where a measurement can detect displacement of an edge of the pattern or a dimension of the pattern. The substrate of FIG. 3 may be subjected to measurement using two substrate measurement recipes A and B. Substrate measurement recipes A and B at least differ with respect to the target measured (e.g., A measures target P and B measures target Q). Substrate measurement recipes A and B may also differ on one or more parameters of their measurement. Substrate measurement recipes A and B may not even be based on the same measurement technique. For example recipe A may be based on SEM measurement and recipe B may be based on AFM measurement.

A target used by a scatterometer may comprise a relatively large periodic structure layout (e.g., comprising one or more gratings), e.g., 40 μm by 40 μm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, when the target can be positioned in among product features, rather than in a scribe lane, the size of a target may be reduced, e.g., to 20 μm by 20 μm or less, or to 10 μm by 10 μm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011/0027704, US2011/0043791 and US2012/0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the substrate. The pattern of the grating is sensitive to chromatic aberrations in the lithographic projection apparatus, particularly the projection system PL, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other measurement processes.

Figure 2B:
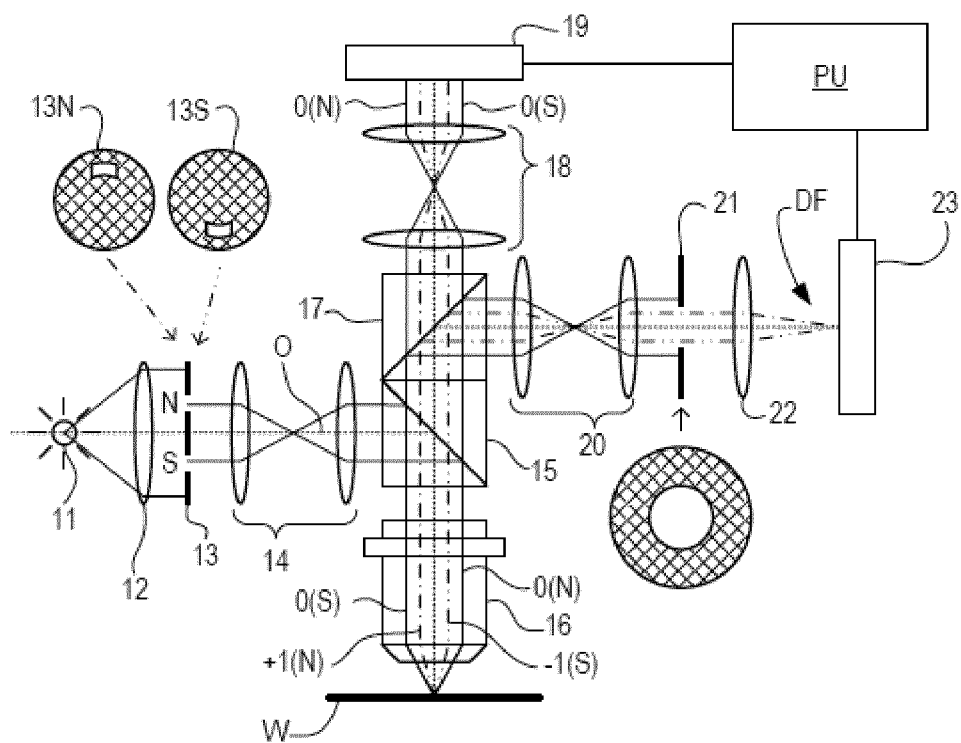
FIG. 2B is schematic diagram of a measurement apparatus for use in measuring targets using a first pair of illumination apertures providing certain illumination modes.

A dark field metrology apparatus is shown in FIG. 2B. A target T (comprising a periodic structure such as a grating) and diffracted rays are illustrated in more detail in FIG. 2C. The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. The radiation may be visible and/or ultraviolet radiation (e.g., radiation selected from the range of about 425 nm to about 880 nm). These lenses are arranged in a double sequence of a 4F arrangement. A different lens arrangement can be used, provided that it still provides a substrate image onto a detector.

The lens arrangement may allow for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals. The parameters of the measurement of a substrate measurement recipe may include the intensity distribution at the pupil plane. A target may be a part of multiple substrate measurement recipes that differ in the intensity distribution at the pupil plane.

Figure 2C:
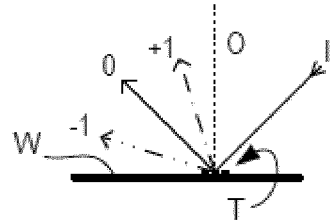
FIG. 2C is a schematic detail of a diffraction spectrum of a target for a given direction of illumination.

As shown in FIG. 2C, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIG. 2B and FIG. 2C are shown somewhat off axis, purely to enable them to be more easily distinguished in the diagram.

At least the 0 and +1 orders diffracted by the target on substrate W are collected by objective lens 16 and directed back through prism 15. Returning to FIG. 2B, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the $-1^{st}$ and the $+1^{st}$ diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

Figure 2D:
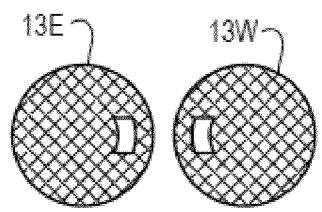
FIG. 2D is a schematic illustration of a second pair of illumination apertures providing further illumination modes in using a measurement apparatus for diffraction based overlay measurements.
Figure 2E:
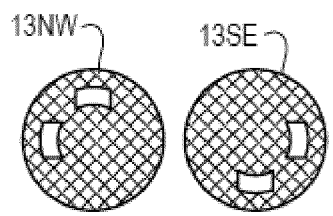
FIG. 2E is a schematic illustration of a third pair of illumination apertures combining the first and second pairs of apertures providing further illumination modes in using a measurement apparatus for diffraction based overlay measurements.

The particular forms of aperture plate 13 and stop 21 shown in FIG. 2D and FIG. 2E are purely examples. In another embodiment of the invention, on-axis illumination of the targets is used and an aperture stop with an off-axis aperture is used to pass substantially only one first order of diffracted radiation to the sensor. In yet other embodiments, 2nd, 3rd and higher order beams (not shown) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIG. 2D and FIG. 2E. FIG. 2D illustrates two further types of off-axis illumination mode. In a first illumination mode of FIG. 2D, aperture plate 13E provides off-axis illumination from a direction designated, for the sake of description only, as 'east' relative to the 'north' previously described. In a second illumination mode of FIG. 2E, aperture plate 13W is used to provide similar illumination, but from an opposite direction, labeled 'west'. FIG. 2E illustrates two further types of off-axis illumination mode. In a first illumination mode of FIG. 2E, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 2F:
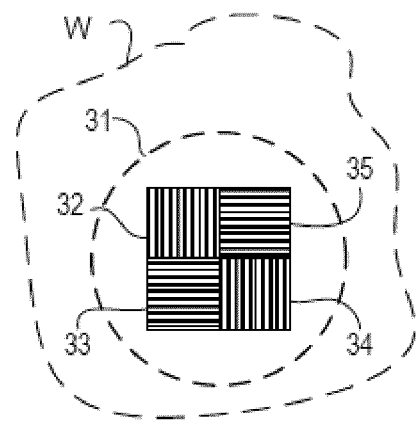
FIG. 2F depicts a form of multiple periodic structure (e.g., multiple grating) target and an outline of a measurement spot on a substrate.

FIG. 2F depicts an example composite metrology target formed on a substrate. The composite target comprises four periodic structures (in this case, gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm×16 µm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Figure 2G:
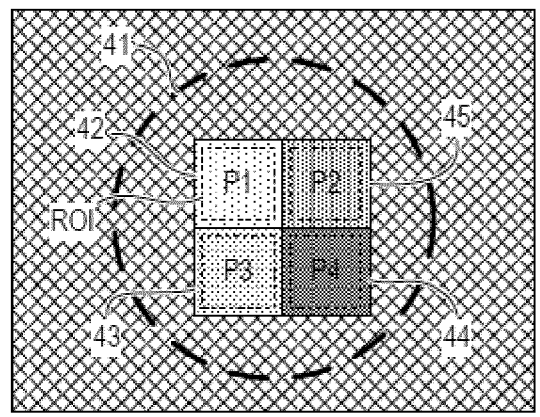
FIG. 2G depicts an image of the target of FIG. 2F obtained in the apparatus of FIG. 2B.

FIG. 2G shows an example of an image that may be formed on and detected by the sensor 23, using the target of FIG. 2F in the apparatus of FIG. 2B, using the aperture plates 13NW or 13SE from FIG. 2E. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. If the periodic structures are located in product areas, product features may also be visible in the periphery of this image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

In the context of a device fabrication process, to determine whether a substrate measurement recipe is accurate and obtain a true value from measurement may be challenging because the true value and systematic error both manifest in the results of the measurement. Namely, they both affect the results and thus the results can have contribution from the true value and contribution from the systematic error. If the contribution of the systematic error can be determined, the true value may be determined from the results of the measurement, subject to random error (i.e., imprecision). The random error (i.e., imprecision) of a measurement may be attributed the nature of the measurement, the apparatus used for the measurement, the environment, or even the physics involved in the measurement. Random error or imprecision can be reduced by repeated measurements because random error in repeated measurements average to zero.

Figure 4A:
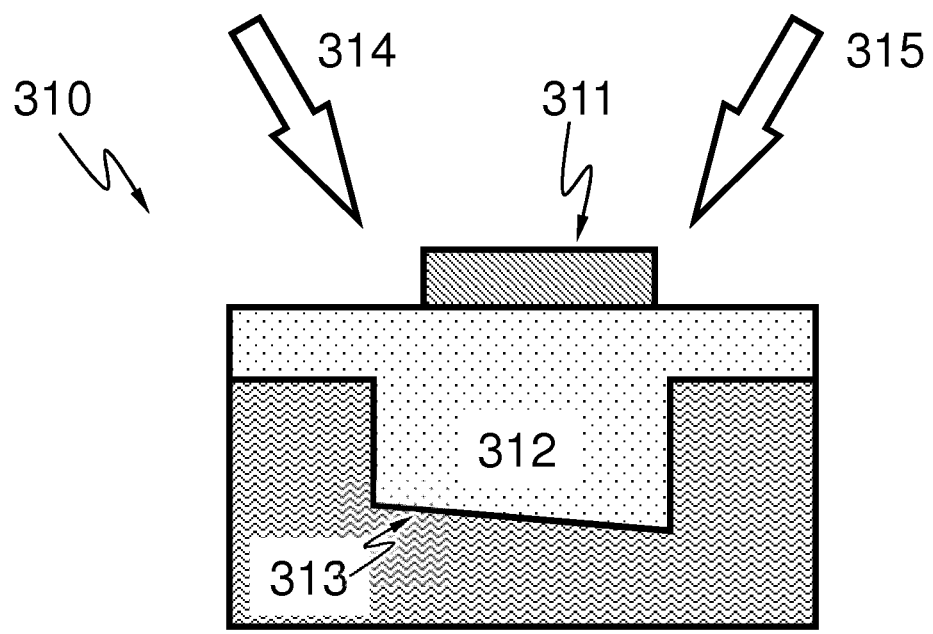
FIG. 4A and FIG. 4B demonstrate how the same target may introduce different systematic errors with different substrate measurement recipes.
Figure 4B:
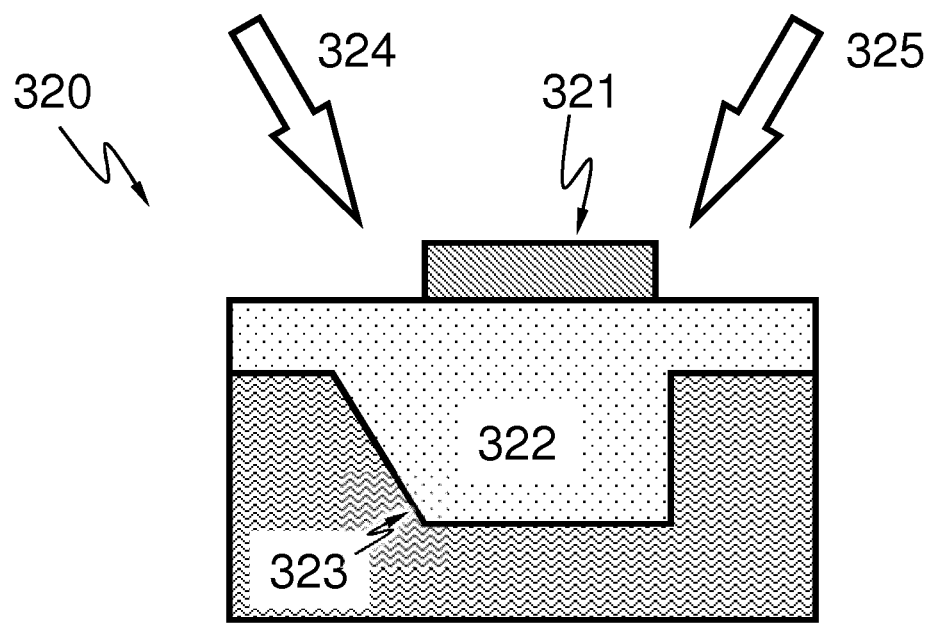

FIG. 4A and FIG. 4B demonstrate how a same target may introduce different systematic errors using different substrate measurement recipes. FIG. 4A schematically shows a cross-sectional view of a target 310 including an upper structure 311 over a trench 312, suitable for measuring overlay error between the upper structure 311 and the trench 312. The bottom 313 of the trench 312 is tilted (not parallel to the substrate) because of the process (e.g., etch, CMP, or other steps in the process). For example, two otherwise identical substrate measurement recipes use radiation beams 314 and 315 at the same incidence angle for substrate measurement, except that the radiation beams 314 and 315 are directed from different directions onto the substrate. Although the beams 314 and 315 have the same angle of incidence relative to the substrate, they do not have the same angle of incidence relative to the bottom 313 of the trench 312 because the bottom 313 is tilted relative to the substrate. Therefore, characteristics of the scattering of the beams 314 and 315 by the target are different.

FIG. 4B schematically shows a cross-sectional view of another target 320 including an upper structure 321 over a trench 322, suitable for measuring overlay error between the upper structure 321 and the trench 322. The sidewall 323 of the trench 322 is tilted (not perpendicular to the substrate) because of the process (e.g., etch, CMP, or other steps in the process). For example, two otherwise identical substrate measurement recipes use radiation beams 324 and 325 at a same incidence angle for substrate measurement, except that the radiation beams 324 and 325 are directed from different directions onto the substrate. Although the beams 324 and 325 have the same angle of incidence relative to the substrate, the beam 324 glances off the sidewall 323 while the beam 325 is almost normal to the sidewall 323. The beam 324 thus is barely scattered by the sidewall 323 but the beam 325 is strongly scattered by the sidewall 323. Therefore, characteristics of the scattering of the beams 324 and 325 by the target are different.

Figure 4C:
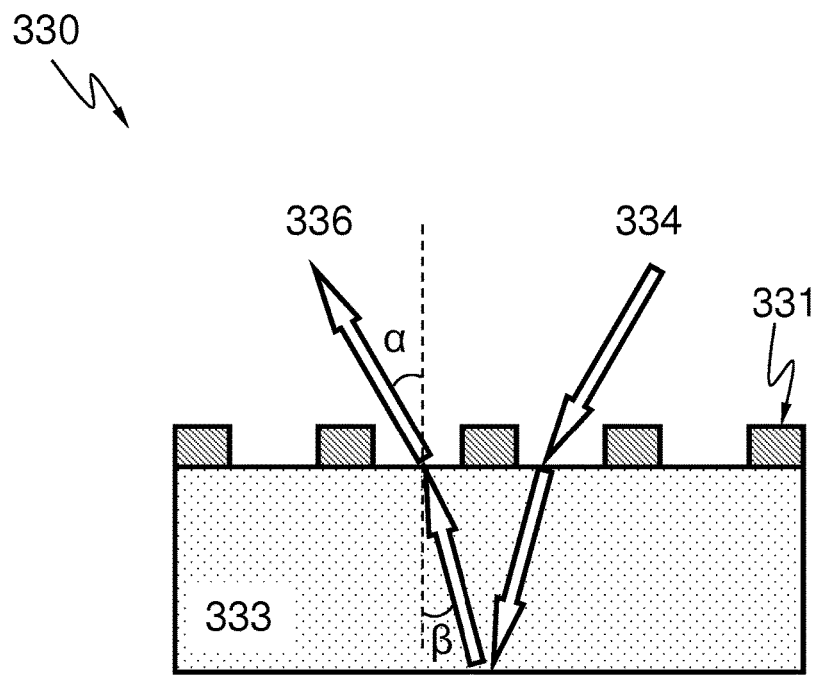
FIG. 4C schematically shows a cross-sectional view of a target 330 including a structure 331 over a stack 333 of one or more layers.

Variations of the optical path of a target may cause errors in measurement results obtained using a substrate measurement recipe. FIG. 4C schematically shows a cross-sectional view of a target 330 including a structure 331 over a stack 333 of one or more layers. The structure 331 may be a grating. The stack 333 may have a semiconductor material, a metal, a dielectric or any other suitable material. A substrate measurement recipe including this target 330 may direct an incident radiation beam 334 to the target 330 and collect scattered radiation 336 from the target 330. When some of the incident radiation penetrates into the stack 333, a variation of the optical path length of the target 330 may affect the scattered radiation 336 and thus affect the measurement results of a measurement performed using the substrate measurement recipe. The optical path length of the target 330 may be attributed to various factors. A non-exhaustive list of examples of the factors include the chemical composition of one or more layers in the stack 333, the thickness of one or more layers in the stack 333, and/or one or more processing conditions of the one or more layers (e.g., annealing, deposition, doping, etc.). Measuring, predicting or simulating these factors may be difficult.

According to an embodiment, the impact on the measurement results of a measurement performed, using a substrate measurement recipe, arising by variation of the optical path length of a target may be estimated or determined from the dependence on the measurement results by a relative change of the wavelength of the incident radiation. Phase accumulated by the radiation travelling through the stack 333 is:

$$\phi = \frac{2\pi}{\lambda} \cdot \frac{2h}{\cos\beta} = \frac{4\pi h}{\lambda \cos\beta}$$

where h is the optical path length of the target 330, λ is the wavelength of the incident radiation and β is the angle shown in FIG. 4C. Therefore, a variation of the optical path length Δh causes the accumulated phase to change by:

$$\Delta\phi = \frac{4\pi(h + \Delta h)}{\lambda \cos\beta} - \frac{4\pi h}{\lambda \cos\beta} = \frac{4\pi \Delta h}{\lambda \cos\beta}$$

and a variation of the wavelength Δλ causes the accumulated phase to change by $$\Delta\phi = \frac{4\pi h}{(\lambda + \Delta\lambda)\cos\beta} - \frac{4\pi h}{\lambda \cos\beta} = \frac{4\pi h}{\cos\beta}\left(\frac{1}{\lambda + \Delta\lambda} - \frac{1}{\lambda}\right).$$

After setting the phase changes to be equal:

$$\frac{4\pi \Delta h}{\lambda \cos\beta} = \frac{4\pi h}{\cos\beta}\left(\frac{1}{\lambda + \Delta\lambda} - \frac{1}{\lambda}\right)$$

yields the equation:

$$\frac{\Delta\lambda}{\lambda} = \frac{-\Delta h}{h + \Delta h}$$

and approximation:

$$\frac{\Delta\lambda}{\lambda} \approx \frac{-\Delta h}{h}.$$

Namely, the same relative change in the wavelength and in the optical path length has approximately the same impact on the measurement results. Using this relationship, the impact on the measurement results by variation of the optical path length of a target can be estimated or determined using the impact on the measurement results by variation of the wavelength of the incident radiation.

Figure 5:
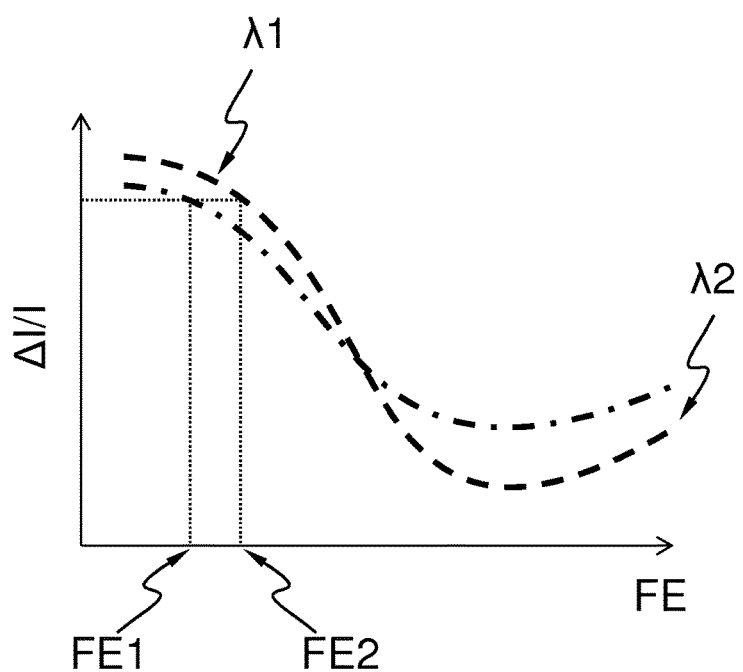
FIG. 5 shows two curves representing the relationships between normalized intensity asymmetry (e.g., in the form of $\Delta I/I$) and focus error (FE) for two substrate measurement recipes that are identical except the wavelengths ($\lambda 1$ and $\lambda 2$, respectively) of the incident radiation.

In an example, this relationship may be used on diffraction based focus measurements. A substrate measurement recipe, which includes a target, may be used to measure the focus of the lithography apparatus during scanning. The focus may be derived from a normalized intensity asymmetry (e.g., ΔI/I) between +1-th and −1-th diffraction orders from the target. The relationship between the normalized intensity asymmetry and the focus error depends on the wavelength used in the substrate measurement recipe. FIG. 5 shows two curves representing the relationships between the normalized intensity asymmetry (in this case ΔI/I) and the focus error (FE) for two substrate measurement recipes that are identical except for the wavelengths (λ1 and λ2, respectively) of the incident radiation. By the same value of the normalized intensity asymmetry obtained by these two substrate measurement recipes, two different FE values (FE1 and FE2) may be derived respectively from the relationships. The impact on FE by the relative change ((λ1−λ2)/λ0) of the wavelength is thus (FE1−FE2), where λ0 can be a nominal wavelength anywhere between λ1 and λ2 under the condition that (λ1−λ2)<<λ1. Using the relationship between the relative change of the wavelength and the relative change of the optical path length derived above, the impact on FE by the relative change −Δh/h of the optical path length is also approximately (FE1−FE2).

Figure 6A:
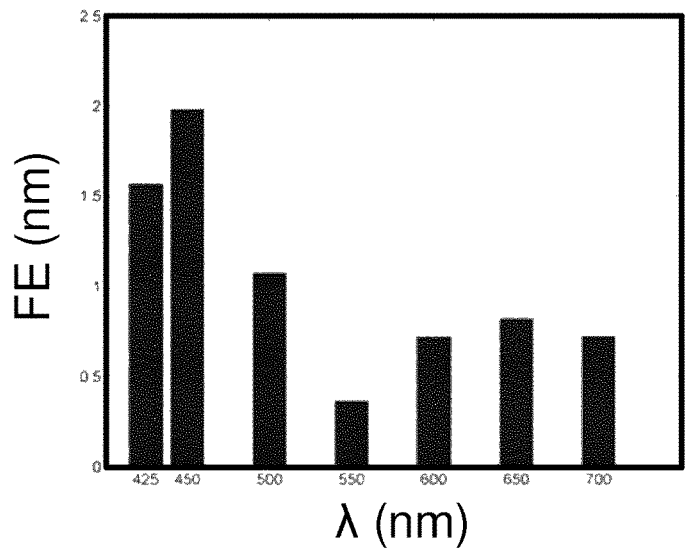
FIG. 6A shows the impact of the focus error with a relative change of optical path length of 1%, as determined using the relationship between the relative change of the wavelength and the relative change of the optical path length derived below, for a few different nominal wavelengths.
Figure 6B:
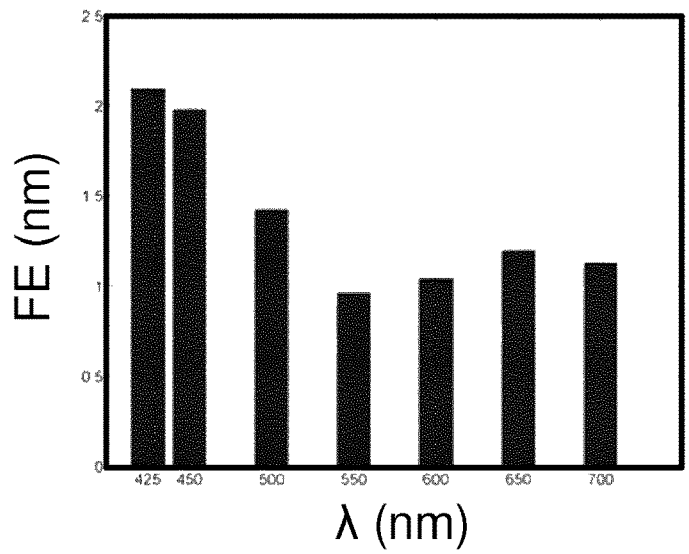
FIG. 6B shows the impact of the focus error with a relative change of optical path length of 1%, as determined by simulation, for a few different nominal wavelengths.
Figure 6C:
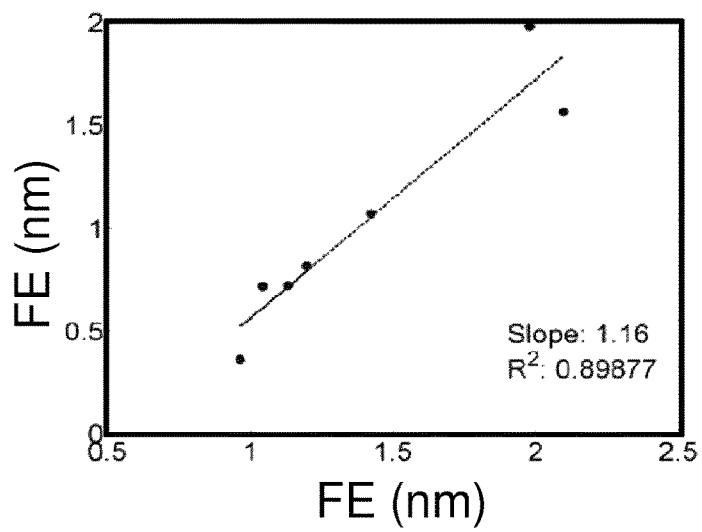
FIG. 6C shows that the impacts as determined by these two approaches match well.

FIG. 6A shows the impact of the focus error with a relative change of optical path length of 1%, as determined using the relationship between the relative change of the wavelength and the relative change of the optical path length derived above, for a few different nominal wavelengths. FIG. 6B shows the impact of the focus error with a relative change of optical path length of 1%, as determined by simulation, for a few different nominal wavelengths. FIG. 6C shows that the impacts as determined by these two approaches match well (horizontal axis: FE by simulation; vertical axis: FE by the relationship between the relative change of the wavelength and the relative change of the optical path length derived above).

Figure 7A:
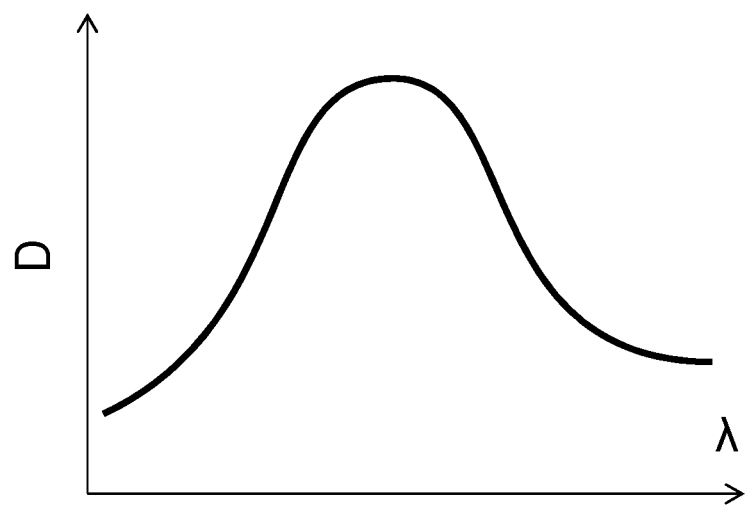
FIG. 7A shows a generic relationship between a measurement result D obtained using a substrate measurement recipe that uses incident radiation with a wavelength $\lambda$ and the wavelength $\lambda$ varies.
Figure 7B:
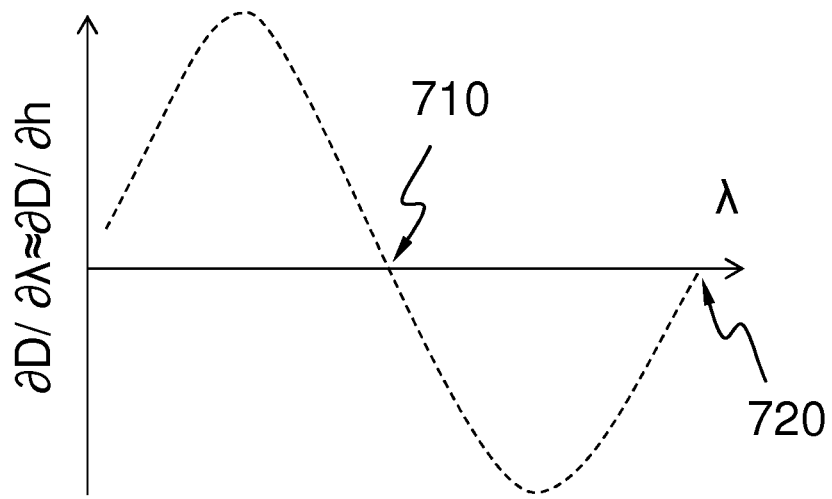
FIG. 7B shows the partial derivative of the measurement result D with respect to the wavelength $\lambda$, the partial derivative itself being a function of the wavelength $\lambda$.

FIG. 7A shows a generic relationship between a measurement result D obtained using a substrate measurement recipe that uses incident radiation with a wavelength λ and the wavelength λ varies. FIG. 7B shows the partial derivative of the measurement result D with respect to the wavelength λ, the partial derivative itself being a function of the wavelength λ. A substrate measurement recipe that uses incident radiation with any of the two wavelengths 710 and 720, or a wavelength in their vicinity (e.g., within 20%, within 15%, within 10%, within 5% or within 2%), is robust against variations of the wavelength, and thus robust against variations of the optical path length of the target used in the substrate measurement recipe.

Figure 8:
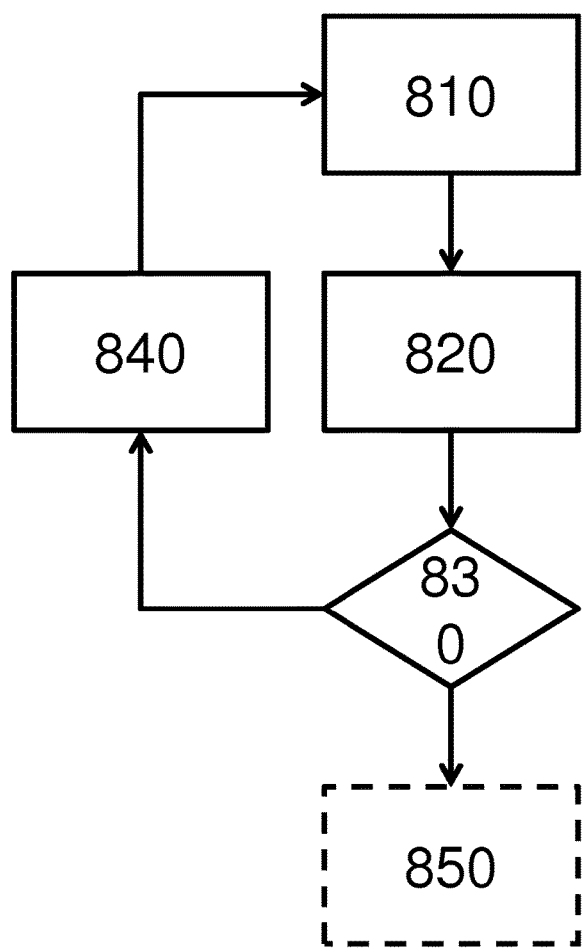
FIG. 8 shows a flow chart for a method of adjusting a substrate measurement recipe.

FIG. 8 shows a flow chart for a method of adjusting a substrate measurement recipe. In procedure 810, a measurement result is obtained from a target on a substrate, by using a substrate measurement recipe. Examples of the measurement result may include overlay error, alignment, focus, or critical dimension. The measurement result may include a normalized intensity asymmetry of two diffraction orders from the target. In procedure 820, a parameter is determined from the measurement result. The parameter characterizes dependence of the measurement result on an optical path length of the target for incident radiation used when measuring in accordance with the substrate measurement recipe. For example, the dependence on the optical path length is dependence on a relative change of the optical path length. The parameter may be a derivative of the measurement result with respect to a relative change of the optical path length of the target. The parameter may be a difference between two sets of measurement results obtained using two substrate measurement recipes with different wavelengths of the incident radiation. The process of determining the parameter comprises determining dependence of the measurement result on a relative change of wavelength of the incident radiation. For example, the process of determining the parameter comprises obtaining measurement results using at least two different wavelengths. From the dependence on the relative change of the wavelength, the dependence on the optical path length can be determined or estimated using the relationship between the relative change of the wavelength and the relative change of the optical path length derived above. In procedure 830, if the parameter is determined to be not in a specific range, the flow goes to procedure 840, where the substrate measurement recipe is adjusted. Adjusting the substrate measurement recipe may include adjusting one or more parameters (e.g., shape or orientation) of at least part of the target associated with the substrate measurement recipe. Adjusting the substrate measurement recipe may include adjusting one or more parameters (e.g., polarization or wavelength of the incident radiation) of a measurement using the substrate measurement recipe. The specific range may represent a range of robustness of the substrate measurement recipe against variation of the optical path length. Once the substrate measurement recipe is adjusted, the flow goes back to the procedure 810. If the parameter is in the specific range, the flow may go to the optional procedure 850, where the substrate measurement recipe is used to inspect another substrate. The substrate measurement recipe may use a single incident beam. The target may have process induced target asymmetry such as shown in FIG. 4A and/or FIG. 4B.

Figure 9:
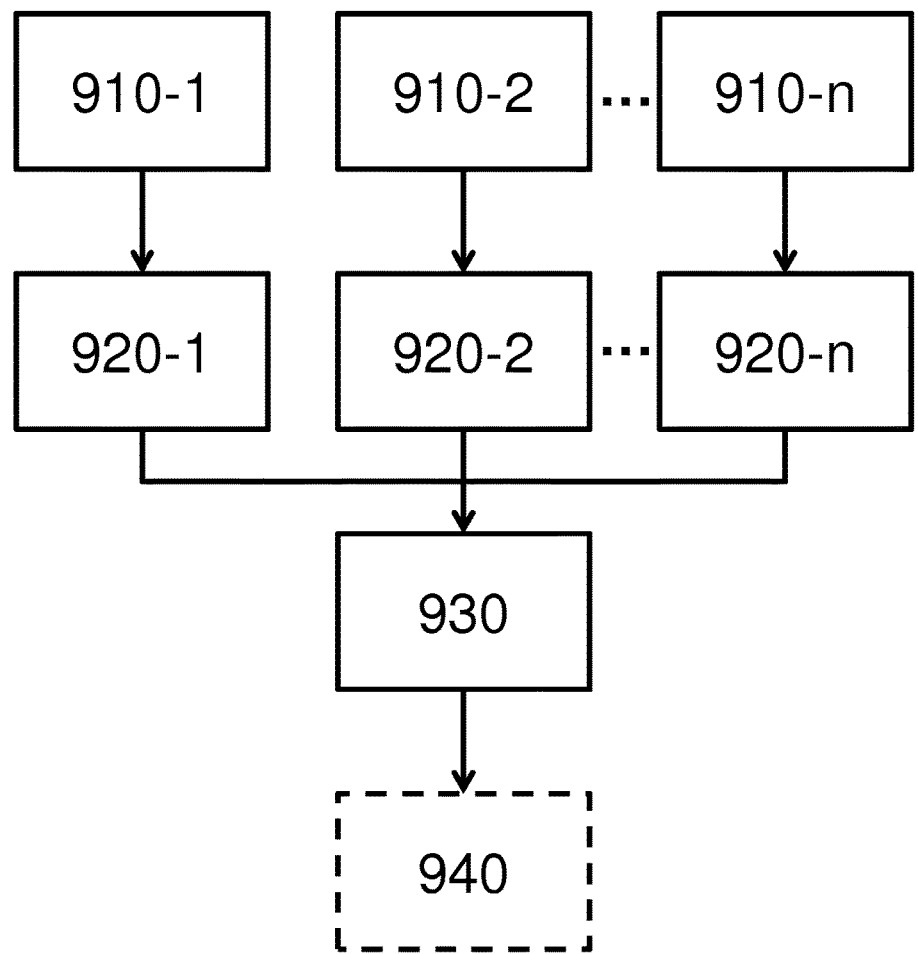
FIG. 9 shows a flow chart for a method of selecting one or more substrate measurement recipes from a group of candidate substrate measurement recipes.

FIG. 9 shows a flow chart for a method of selecting one or more substrate measurement recipes from a group of candidate substrate measurement recipes. In each of procedures 910-1, 910-2, . . . , 910-n, a measurement result is obtained from a target on a substrate, by using one recipe of the group of substrate measurement recipes. Examples of the measurement result may include overlay error, alignment, focus, or critical dimension. The measurement result may include a normalized intensity asymmetry of two diffraction orders from the target. In each of procedures 920-1, 920-2, . . . , 920-n, a parameter is determined for each substrate measurement recipe from each of the measurement results. The parameter characterizes dependence of the measurement result on an optical path length of the target for incident radiation used when measuring in accordance with the substrate measurement recipe. For example, the dependence on the optical path length can be a dependence on a relative change of the optical path length. The parameter may be a derivative of the measurement result with respect to a relative change of the optical path length of the target. The parameter may be a difference between two sets of measurement results obtained using two substrate measurement recipes with different wavelengths of the incident radiation. The process of determining the parameter may include determining dependence of the measurement result on a relative change of wavelength of the incident radiation. For example, the process of determining the parameter comprises obtaining measurement results using at least two different wavelengths. From the dependence on the relative change of the wavelength, the dependence on the optical path length can be determined or estimated using the relationship between the relative change of the wavelength and the relative change of the optical path length derived above. In procedure 930, at least one substrate measurement recipe is selected from the group based on the parameters. In optional procedure 940, the selected substrate measurement recipe is used to inspect another substrate. At least one recipe from the group of substrate measurement recipes may use a single incident beam. The target may have process induced target asymmetry such as shown in FIG. 4A and/or FIG. 4B.

Thus, in an embodiment, a method of through-wavelength similarity is provided that is based on recognition of essentially equivalence between target stack changes and measurement beam wavelength changes. This can be enabled if, for example, the stack can be described as a homogeneous effective medium with refractive index n and thickness h, and stack variations modify the phase of the radiation traveling through the stack (the radiation is reflected at the bottom of the stack and interacts with the radiation diffracted by the target into the environment, towards the sensor). Specifically, regarding the phase of the radiation travelling through the stack, a change in wavelength is essentially equivalent to a change in stack height (e.g., provided those wavelength changes are small enough so the difference in interaction of the radiation with the target structure is negligible).

The through-wavelength similarity (i.e., the link between a relative change in stack variation, in this case height variation, (Dh/h) and a relative change in wavelength variation (Dl/l)) can be used in various application. For example, the robustness desired to be known is the impact on a measurement result of a relative change of stack (Dh/h), but this change of stack may not be determined directly. But, with data measured at multiple wavelengths, the impact of a relative change of wavelength (Dl/l) to a measurement result can be calculated. As these two changes are essentially equivalent as described above, data collected at different wavelengths can be used to calculate the impact of stack variations.

In an embodiment, to calculate the impact of a change in wavelength, any metric can be used that allows calculation of a focus error (during exposure) between calibration curves of, e.g., the measured intensity asymmetry (e.g., of diffraction orders) as a function of focus error (e.g., defocus) for different measurement beam wavelengths. This metric could be a difference between the curves evaluated with a weighting function that is higher around the nominal focus. Another option for this metric is to use a similarity method which includes the calculation of a weighted mean and $3\sigma$ (the weight function being a block with smooth edges which accounts for offset and focus uniformity), local maximum absolute difference, or maximum absolute weighted local slope (the weight function being in this case a Gaussian function which accounts for focus uniformity). With an appropriate metric, calibration curves measured in different circumstances (typically same target and wavelength measured on different measurement apparatuses) can be compared and a focus error impact can be obtained corresponding to the case in which one calibration curve is used to calculate focus when the other one should have been used. For the robustness calculation, the metric can be applied to each pair of measured wavelengths. The resulting focus error is divided by the difference between the wavelengths (in nm) and then normalized to the nominal wavelength. Thus, there is derived the error generated by a relative change of wavelength which is essentially equivalent to the error generated by the same relative stack change.

In an embodiment, robustness per wavelength can be estimated using the same principle by evaluating the variation through wavelength of the curves in terms of their fitting coefficients. If the fitting coefficients of the calibration curves vary smoothly through wavelength (typically in simple stacks), they can be fitted and the fitting data can be used to estimate the calibration curves after a certain (limited) relative wavelength variation. These estimated curves can be used in the similarity metric explained before. Using an expansion in orthogonal polynomials and data from a measurement apparatus that provides a denser (or continuum) wavelength sampling would be suitable for this method provided that the evaluated variations of the coefficients are limited.

Figure 10:
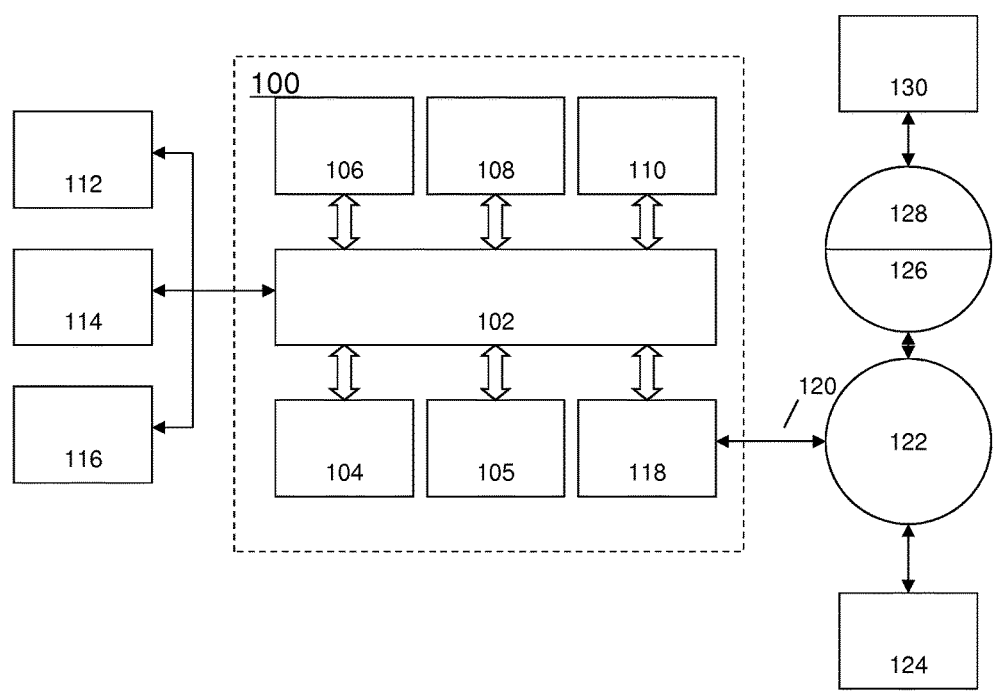
FIG. 10 is a block diagram of an example computer system.

FIG. 10 is a block diagram that illustrates a computer system 100 which can assist in implementing the methods and flows disclosed herein. Computer system 100 includes a bus 102 or other communication mechanism to communicate information, and a processor 104 (or multiple processors 104 and 105) coupled with bus 102 to process information. Computer system 100 may also include a main memory 106, such as a random access memory (RAM) or other dynamic storage device, coupled to bus 102 to store and/or supply information and instructions to be executed by processor 104. Main memory 106 may be used to store and/or supply temporary variables or other intermediate information during execution of instructions to be executed by processor 104. Computer system 100 may further include a read only memory (ROM) 108 or other static storage device coupled to bus 102 to store and/or supply static information and instructions for processor 104. A storage device 110, such as a magnetic disk or optical disk, may be provided and coupled to bus 102 to store and/or supply information and instructions.

Computer system 100 may be coupled via bus 102 to a display 112, such as a cathode ray tube (CRT) or flat panel or touch panel display, to display information to a computer user. An input device 114, including alphanumeric and other keys, may be coupled to bus 102 to communicate information and command selections to processor 104. Another type of user input device may be cursor control 116, such as a mouse, a trackball, or cursor direction keys, to communicate direction information and command selections to processor 104 and to control cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a method described herein may be performed by computer system 100 in response to processor 104 executing one or more sequences of one or more instructions. In an embodiment, the computer system 100 can be part of a lithographic apparatus, part of a metrology system, a stand-alone system that is connected to the lithographic apparatus and/or metrology system, etc.

Such instructions may be contained in main memory 106 and may be read into main memory 106 from another computer-readable medium, such as storage device 110. Execution of the sequences of instructions contained in main memory 106 causes processor 104 to perform the process steps described herein. One or more processors in a multi-processing arrangement may be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or radiation waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a disk or memory of a remote computer. The remote computer can load the instructions into its dynamic memory and send the instructions over a communications path. Computer system 100 can receive the data from the path and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may include a communication interface 118 coupled to bus 102. Communication interface 118 provides a two-way data communication coupling to a network link 120 that is connected to a network 122. For example, communication interface 118 may provide a wired or wireless data communication connection. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through network 122 to a host computer 124 or to data equipment operated by an Internet Service Provider (ISP) 126. ISP 126 in turn provides data communication services through the worldwide packet data communication network, now commonly referred to as the "Internet" 128. Network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, network 122 and communication interface 118. One such downloaded application may provide for the code to implement a method herein, for example. The received code may be executed by processor 104 as it is received, and/or stored in storage device 110, or other non-volatile storage for later execution. In this manner, computer system 100 may obtain application code in the form of a carrier wave.

Figure 11:
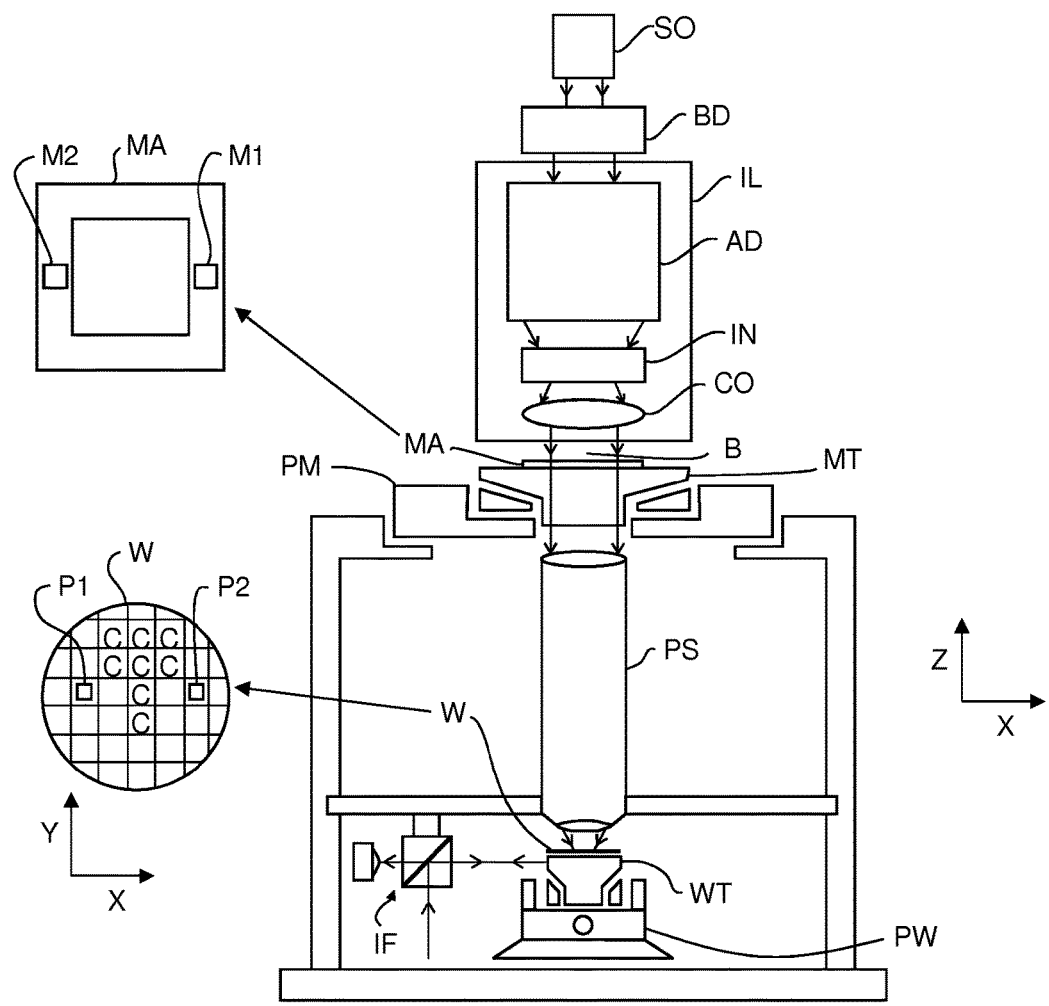
FIG. 11 is a schematic diagram of a lithographic apparatus.

FIG. 11 schematically depicts an exemplary lithographic apparatus. The apparatus comprises:
- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner PM to accurately position the patterning device with respect to item PS;

a second object table (substrate table) WT provided with a substrate holder to hold a substrate W (e.g., a resist-coated silicon wafer), and connected to a second positioner PW to accurately position the substrate with respect to item PS;

a projection system PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander. The illuminator IL may comprise an adjuster AD configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 11 that the source SO may be within the housing of the lithographic apparatus (as is often the case when the source SO is a mercury lamp, for example), but that it may also be remote from the lithographic apparatus, the radiation beam that it produces being led into the apparatus (e.g., with the aid of suitable directing mirrors BD); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the projection system PS, which focuses the beam B onto a target portion C of the substrate W. With the aid of the second positioner PW (and interferometer IF), the substrate table WT can be moved accurately, e.g. so as to position different target portions C in the path of the beam B. Similarly, the first positioner PM can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 11.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features.

Figure 12:
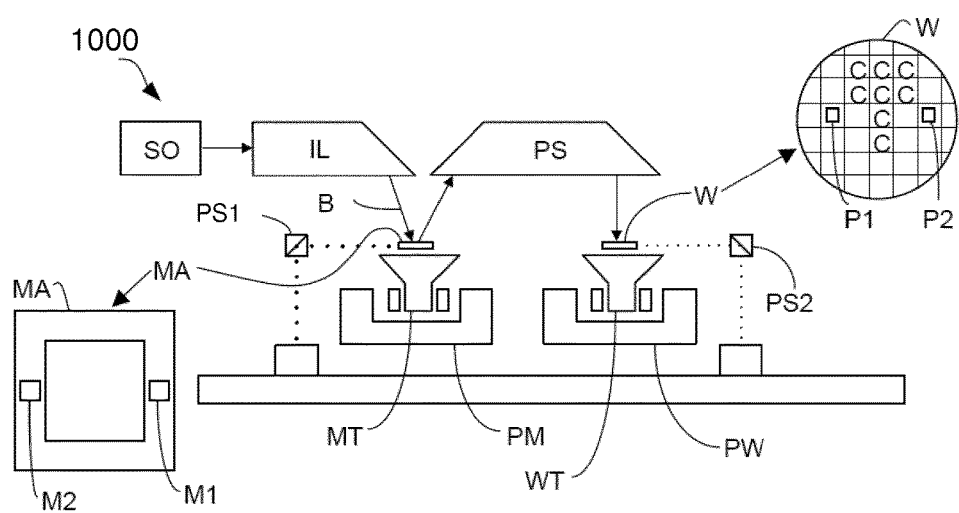
FIG. 12 is a schematic diagram of another lithographic apparatus.

FIG. 12 schematically depicts another exemplary lithographic apparatus 1000. The lithographic apparatus 1000 includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have a multi-layer reflector comprising, for example, a multi-stack of molybdenum and silicon. In one example, the multi-stack reflector has a 40 layer pairs of molybdenum and silicon. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 12, the illuminator IL receives an extreme ultra violet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 12, to provide the laser beam to excite the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously in a given direction (the so-called "scan direction") while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Further, the lithographic apparatus may be of a type having two or more tables (e.g., two or more substrate table, two or more patterning device tables, and/or a substrate table and a table without a substrate). In such "multiple stage" devices the additional tables may be used in parallel, or preparatory steps may be carried out on one or more tables while one or more other tables are being used for exposures. Twin stage lithographic apparatuses are described, for example, in U.S. Pat. No. 5,969,441, incorporated herein by reference in its entirety.

Figure 13:
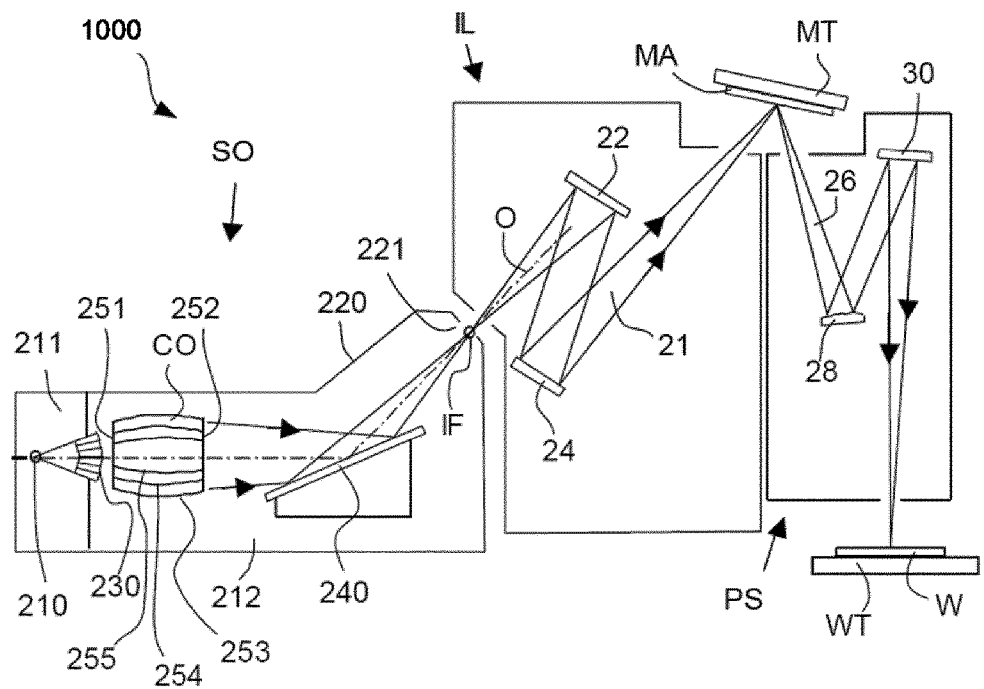
FIG. 13 is a more detailed view of the apparatus in FIG. 12.

FIG. 13 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 13.

Collector optic CO, as illustrated in FIG. 13, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma source, often called a DPP source. Alternatively, the source collector module SO may be part of an LPP radiation system.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The concepts disclosed herein may be used with any device manufacturing process involving a lithographic apparatus, and may be especially useful with emerging imaging technologies capable of producing wavelengths of an increasingly smaller size. Emerging technologies already in use include deep ultraviolet (DUV) lithography that is capable of producing a 193 nm wavelength with the use of an ArF laser, and even a 157 nm wavelength with the use of a fluorine laser. Moreover, EUV lithography is capable of producing wavelengths within a range of 5-20 nm.

While the concepts disclosed herein may be used for device manufacturing on a substrate such as a silicon wafer, it shall be understood that the disclosed concepts may be used with any type of lithographic imaging systems, e.g., those used for imaging on substrates other than silicon wafers.

The patterning device referred to above comprises or can form a design layout. The design layout can be generated utilizing a CAD (computer-aided design) program. This process is often referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable LCD array.

As noted, microlithography is a significant step in the manufacturing of devices such as ICs, where patterns formed on substrates define functional elements of the ICs, such as microprocessors, memory chips etc. Similar lithographic techniques are also used in the formation of flat panel displays, micro-electro mechanical systems (MEMS) and other devices.

The process in which features with dimensions smaller than the classical resolution limit of a lithographic apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

As an example, OPC addresses the fact that the final size and placement of an image of the design layout projected on the substrate will not be identical to, or simply depend only on the size and placement of the design layout on the patterning device. A person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

To help ensure that the projected image of the design layout is in accordance with requirements of a given target circuit design, proximity effects may be predicted and compensated for, using sophisticated numerical models, corrections or pre-distortions of the design layout. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Applying OPC is generally not an "exact science", but an empirical, iterative process that does not always compensate for all possible proximity effect. Therefore, the effect of OPC, e.g., design layouts after application of OPC and any other RET, should be verified by design inspection, i.e. intensive full-chip simulation using calibrated numerical process models, in order to minimize the possibility of design flaws being built into the patterning device pattern. Both OPC and full-chip RET verification may be based on numerical modeling systems.

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. As is known, off-axis illumination, such as annular, quadrupole, and dipole, is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be used. For example, the source can be partitioned into several regions, each of which corresponds to a certain region of the pupil spectrum. Then, the source distribution is assumed to be uniform in each source region and the brightness of each region is optimized for the process window. In another example, a method is used based on illuminator pixels and that converts the source optimization problem into a series of non-negative least square optimizations.

For low $k_1$ photolithography, optimization of both the source and patterning device is useful to ensure a viable process window for projection of critical circuit patterns. Some algorithms discretize illumination into independent source points and the patterning device pattern into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of an apparatus or a device manufacturing process, for example, parameters a user of the lithographic apparatus can adjust, or image characteristics a user can adjust by adjusting those parameters. It should be appreciated that any characteristics of a device manufacturing process, including those of the source, the patterning device, the projection optics, and/or resist characteristics can be among the design variables in the optimization. The cost function is often a non-linear function of the design variables. Then standard optimization techniques are used to minimize the cost function.

A source and patterning device (design layout) optimization method and system that allows for simultaneous optimization of the source and patterning device using a cost function without constraints and within a practicable amount of time is described in a commonly assigned PCT Patent Application Publication No. WO2010/059954, which is hereby incorporated by reference in its entirety.

Another source and mask optimization method and system that involves optimizing the source by adjusting pixels of the source is described in U.S. Patent Application Publication No. 2010/0315614, which is hereby incorporated by reference in its entirety.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic apparatus, no matter where the optical component is located on an optical path of the lithographic apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

Further embodiments of the invention are disclosed in below numbered clauses:

1. A method comprising:
   obtaining a measurement result from a target on a substrate, by using a substrate measurement recipe;
   determining, by a hardware computer system, a parameter from the measurement result, wherein the parameter characterizes dependence of the measurement result on an optical path length of the target for incident radiation used in accordance with the substrate measurement recipe and the determining the parameter comprises determining dependence of the measurement result on a relative change of wavelength of the incident radiation; and
   if the parameter is not within a specified range, adjusting the substrate measurement recipe.

2. The method of clause 1, wherein the measurement result comprises an overlay error, alignment, focus, or critical dimension.

3. The method of clause 1 or clause 2, wherein the measurement result comprises a normalized intensity asymmetry of two diffraction orders from the target.

4. The method of any of clauses 1-3, wherein the parameter is a derivative of the measurement result with respect to a relative change of the optical path length.

5. The method of any of clauses 1-4, wherein determining the parameter comprises obtaining measurement results using at least two different wavelengths.

6. The method of any of clauses 1-5, wherein the parameter is a difference between two sets of measurement results obtained using two substrate measurement recipes with different wavelengths of the incident radiation.

7. The method of any of clauses 1-6, wherein adjusting the substrate measurement recipe comprises adjusting a parameter of a measurement target structure associated with the substrate measurement recipe.

8. The method of clause 7, wherein the parameter of the target comprises a shape or orientation of at least part of the measurement target structure.

9. The method of any of clauses 1-8, wherein adjusting the substrate measurement recipe comprises adjusting a parameter of a measurement using the substrate measurement recipe.

10. The method of clause 9, wherein the parameter of the measurement comprises polarization or wavelength of the incident measurement radiation.

11. The method of any of clauses 1-10, wherein the substrate measurement recipe uses a single incident beam.

12. The method of any of clauses 1-11, wherein a measurement target structure measured using the substrate measurement recipe has processed induced target asymmetry.

13. The method of any of clauses 1-12, further comprising inspecting another substrate using the substrate measurement recipe.

14. A method comprising:
obtaining a measurement result from a target on a substrate, by using each of a plurality of substrate measurement recipes;
determining, by a hardware computer system, a parameter from each of the measurement results, wherein the parameter characterizes dependence of the measurement result on an optical path length of the target for incident radiation used in accordance with the substrate measurement recipe to obtain the measurement result; and
selecting at least one substrate measurement recipe from the plurality based on the parameters.

15. The method of clause 14, wherein determining the parameter comprises determining dependence of the measurement result on a relative change of wavelength of the incident radiation.

16. The method of clause 14 or clause 15, wherein the measurement result comprises an overlay error, focus, alignment, or critical dimension.

17. The method of any of clauses 14-16, wherein the measurement result comprises a normalized intensity asymmetry of two diffraction orders from the target.

18. The method of any of clauses 14-17, wherein the parameter is a derivative of the measurement result with respect to a relative change of the optical path length.

19. The method of any of clauses 14-18, wherein determining the parameter comprises obtaining measurement results using at least two different wavelengths.

20. The method of any of clauses 14-19, wherein the parameter is a difference between two sets of measurement results obtained using two substrate measurement recipes with different wavelengths of the incident radiation.

21. The method of any of clauses 14-20, wherein at least one of the plurality of substrate measurement recipes uses a single incident beam.

22. The method of any of clauses 14-21, wherein a target measured using at least one of the plurality of substrate measurement recipes has processed induced target asymmetry.

23. The method of any of clauses 14-22, further comprising inspecting another substrate using the selected substrate measurement recipe.

24. A computer program product comprising a non-transitory computer readable medium having instructions recorded thereon, the instructions when executed by a computer implementing the method of any of clauses 1-23.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Thus, a lithographic apparatus using the imprint technology typically include a template holder to hold an imprint template, a substrate table to hold a substrate and one or more actuators to cause relative movement between the substrate and the imprint template so that the pattern of the imprint template can be imprinted onto a layer of the substrate.

The descriptions above are intended to be illustrative, not limiting. Thus, it will be apparent to one skilled in the art that modifications may be made as described without departing from the scope of the claims set out below.

What is claimed is:

1. A method comprising:
obtaining a measurement result from a target on a substrate, by using a substrate measurement recipe;
determining, by a hardware computer system, a parameter value from the measurement result, wherein the parameter characterizes dependence of the measurement result on an optical path length of the target for incident radiation used in accordance with the substrate measurement recipe and the determining the parameter value comprises determining dependence of the measurement result on a relative change of wavelength of the incident radiation; and
responsive to the parameter value not being within a specified range, adjusting the substrate measurement recipe.

2. The method of claim 1, wherein the measurement result comprises an overlay error, alignment, focus, or critical dimension.

3. The method of claim 1, wherein the measurement result comprises a normalized intensity asymmetry of two diffraction orders from the target.

4. The method of claim 1, wherein the parameter is a derivative of the measurement result with respect to a relative change of the optical path length.

5. The method of claim 1, wherein determining the parameter value comprises obtaining measurement results using at least two different wavelengths.

6. The method of claim 1, wherein the parameter is a difference between two sets of measurement results obtained using two substrate measurement recipes with different wavelengths of the incident radiation.

7. The method of claim 1, wherein adjusting the substrate measurement recipe comprises adjusting a parameter of a measurement target structure associated with the substrate measurement recipe.

8. The method of claim 7, wherein the parameter of the target comprises a shape or orientation of at least part of the measurement target structure.

9. The method of claim 1, wherein adjusting the substrate measurement recipe comprises adjusting a parameter of a measurement using the substrate measurement recipe.

10. The method of claim 9, wherein the parameter of the measurement comprises polarization or wavelength of the incident measurement radiation.

11. A method comprising:
obtaining a measurement result from a target on a substrate, by using each of a plurality of substrate measurement recipes;

determining, by a hardware computer system, a parameter value from each of the measurement results, wherein the parameter characterizes dependence of the measurement result on an optical path length of the target for incident radiation used in accordance with the substrate measurement recipe to obtain the measurement result; and selecting at least one substrate measurement recipe from the plurality of substrate measurement recipes based on the parameter values.

12. The method of claim 11, wherein determining the parameter value comprises determining dependence of the measurement result on a relative change of wavelength of the incident radiation.

13. The method of claim 11, wherein the measurement result comprises an overlay error, focus, alignment, or critical dimension.

14. A computer program product comprising a non-transitory computer readable medium having instructions recorded thereon, the instructions when executed by a computer implementing the method of claim 11.

15. A computer program product comprising a non-transitory computer readable medium having instructions recorded thereon, the instructions when executed by a computer system configured to cause the computer system to at least:

obtain a measurement result from a target on a substrate, the measurement using a substrate measurement recipe;

determine a parameter value from the measurement result, wherein the parameter characterizes dependence of the measurement result on an optical path length of the target for incident radiation used in accordance with the substrate measurement recipe and the determination of the parameter value comprises determination of dependence of the measurement result on a relative change of wavelength of the incident radiation; and responsive to the parameter value not being within a specified range, adjust the substrate measurement recipe.

16. The computer program product of claim 15, wherein the parameter is a derivative of the measurement result with respect to a relative change of the optical path length.

17. The computer program product of claim 15, wherein determination of the parameter value comprises obtaining measurement results using at least two different wavelengths.

18. The computer program product of claim 15, wherein the parameter is a difference between two sets of measurement results obtained using two substrate measurement recipes with different wavelengths of the incident radiation.

19. The computer program product of claim 15, wherein adjustment of the substrate measurement recipe comprises adjustment of a parameter of a measurement target structure associated with the substrate measurement recipe.

20. The computer program product of claim 15, wherein adjustment of the substrate measurement recipe comprises adjustment of a parameter of a measurement using the substrate measurement recipe.

* * * * *